US007362132B2

United States Patent
Imafuku

(10) Patent No.: US 7,362,132 B2
(45) Date of Patent: Apr. 22, 2008

(54) RECONFIGURABLE INTEGRATED CIRCUIT DEVICE TO AUTOMATICALLY CONFIGURE AN INITIALIZATION CIRCUIT

(75) Inventor: Kazuaki Imafuku, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 47 days.

(21) Appl. No.: 11/524,386

(22) Filed: Sep. 21, 2006

(65) Prior Publication Data

US 2007/0279087 A1 Dec. 6, 2007

(30) Foreign Application Priority Data

May 30, 2006 (JP) ............................ 2006-150087

(51) Int. Cl.
*H03K 19/173* (2006.01)

(52) U.S. Cl. ............................................ 326/38; 713/1

(58) Field of Classification Search ............ 326/37–41; 713/1, 2, 100
See application file for complete search history.

(56) References Cited

U.S. PATENT DOCUMENTS 7,191,372 B1 * 3/2007 Jacobson et al. ........... 714/724
7,219,237 B1 * 5/2007 Trimberger ................. 713/193
7,266,680 B1 * 9/2007 Reinbold .................... 713/100
2006/0053246 A1 * 3/2006 Lee ........................... 711/100
2007/0043939 A1 * 2/2007 Fallon et al. ................. 713/2

FOREIGN PATENT DOCUMENTS

JP 2001-312481 11/2001

* cited by examiner

*Primary Examiner*—Don Le
(74) *Attorney, Agent, or Firm*—Staas & Halsey LLP

(57) ABSTRACT

A reconfigurable integrated circuit device which is configured to an arbitrary computation state based on configuration data has a reconfiguration circuit unit, having a plurality of processor elements which are reconfigurable and a processor element network which connects the processor elements in an arbitrary state; and, a configuration control section, which supplies configuration data to the processor elements and to the processor element network, to configure the reconfiguration circuit unit in an arbitrary state. In response to reset, at least a portion of the reconfiguration circuit unit is configured as a memory initialization circuit which writes initial values to internal memory or to external memory, and, after completion of operation of the memory initialization circuit, the configuration control section begins supplying the configuration data.

11 Claims, 9 Drawing Sheets

ERST
12
IRST
13
SEQ
IVNT
131
PR
CD
Q
D
CL
132
CDS
CFG-
RAM
133
11
CFG-CON
CD
TO EXTERNAL RAM
TO WORKING RAM
PE1
PE2
PE3
PE4
10
PE5
RAM
1
PE6
RAM
2
PE7
PE8
PE9
PE10

10.RECONFIGURATION CIRCUIT UNIT
NET
IN-PORT
22
OUT-PORT
24
41c
41b
41a
41
CDS
SEL
PE0 ALU
PE1 ALU
PE2 ALU
PE3 ALU
PE4 ETC
PE5 RAM
CS0
CS1
CS2
CS3
CD0
CD1
CD2
CD3
CD4
CD5
42
43
44
FF
CD
CK

EXAMPLE OF EXECUTION FOR (a+b)*(c-d)
RESULT OUTPUT
a
b
c
d
PE0
ALU
+
A = a+b
PE1
ALU
−
B = c−d
PE2
ALU
PE3
ALU
C = A*B
PE6
ALU

RECONFIGURABLE INTEGRATED CIRCUIT DEVICE TO AUTOMATICALLY CONFIGURE AN INITIALIZATION CIRCUIT

CROSS-REFERENCE TO RELATED APPLICATIONS

This application is based upon and claims the benefit of priority from the prior Japanese Patent Application No. 2006-150087, filed on May 30, 2006, the entire contents of which are incorporated herein by reference.

BACKGROUND OF THE INVENTION

1. Field of the Invention

This invention relates to a reconfigurable integrated circuit device, and in particular to a reconfigurable integrated circuit device which automatically configures an initialization circuit to initialize internal or external memory when power is turned on.

2. Description of the Related Art

A reconfigurable integrated circuit device has a plurality of processor elements and a network which connects processor elements, and configures the processor elements and network into an arbitrary computation state or computation circuit based on configuration data output by a sequencer in response to an external or internal event.

Programmable microprocessors of the prior art generally read instructions stored in memory and process the instructions sequentially. Hence the number of instructions which can be executed simultaneously by a single microprocessor is limited, and there are limits to the processing capacity.

On the other hand, the above reconfigurable integrated circuit device is provided with a plurality of different types of processor elements, such as an ALU having adder, multiplier, comparator and other functions, and a delay circuit or counter, and in addition a network connecting the processor elements is provided, so that the processor elements and network are reconfigured into a desired configuration based on configuration data from a state transition control section comprising sequencer, and prescribed computations are executed in this computation state. A plurality of computation circuits are configured in advance by a plurality of processor elements, so that the computation circuits can perform data processing simultaneously. And, when a data processing is completed in one state, other configuration data can be used to configure another computation state, and a different data processing can be performed in that state.

In this way, a reconfigurable integrated circuit device can dynamically reconfigure different computation states, so that data processing performance for large volumes of data is improved, and overall processing efficiency can be enhanced. Reconfigurable integrated circuit devices are for example described in Japanese Patent Laid-open No. 2001-312481.

In general, integrated circuit devices execute various initialization processing when power is turned on, and after initialization processing ends an internal reset is cancelled, and normal operation is performed. Initialization processing at the time power is turned on may include, for example, operation to initialize a PLL circuit which generates an internal clock in sync with an external clock, initialization of registers in which various parameters are set, and data downloading. In a reconfigurable integrated circuit device also, initialization processing must similarly be performed when power is turned on, and a circuit must be provided in advance for this initialization processing. Or, when the CPU executes an initialization program, the initialization program must be provided in advance in program memory.

However, a circuit to perform this initialization processing operates only during a fixed interval at the time power is turned on, and in normal operation after the internal reset is cancelled may no longer be necessary. Hence the provision of such a circuit for initialization processing separately from a reconfigurable circuit results in a larger circuit scale, and is undesirable. Similarly in the case of an initialization program, the program volume is increased, which is undesirable.

Further, internal memory is incorporated within integrated circuit devices, and external memory is connected externally. When a reconfigurable circuit unit is incorporated, the reconfigurable circuit unit also has a memory element. Hence numerous processes are required in order to initialize the data within this plurality of memory elements.

SUMMARY OF THE INVENTION

Hence an object of the invention is to provide a reconfigurable integrated circuit device in which there is no need to provided as a dedicated circuit a memory initialization circuit which operates upon reset when power is turned on, or in which the circuit scale of such a circuit can be made small.

A further object of the invention is to provide a reconfigurable integrated circuit device capable of high-speed memory initialization operation performed upon reset when power is turned on.

In order to attain the above objects, according to a first aspect of the invention, a reconfigurable integrated circuit device which is configured to an arbitrary computation state based on configuration data has a reconfiguration circuit unit, having a plurality of processor elements which are reconfigurable and a processor element network which connects the processor elements in an arbitrary state; and, a configuration control section, which supplies configuration data to the processor elements and to the processor element network, to configure the reconfiguration circuit unit in an arbitrary state;

wherein, in response to reset, at least a portion of the reconfiguration circuit unit is configured as a memory initialization circuit which writes initial values to internal memory or to external memory, and, after completion of operation of the memory initialization circuit, the configuration control section begins supplying the configuration data.

The reconfigurable integrated circuit device according to a preferred mode of the first aspect of the invention further comprises a configuration register which acquires the configuration data in response to a state transition signal from the configuration control section, wherein, based on the configuration data acquired by the configuration register, the reconfiguration circuit unit is configured in the arbitrary state, and in response to the reset, the configuration register is initialized to initialization configuration data corresponding to the memory initialization circuit state.

According to a preferred mode of the first aspect of the invention, the configuration register has a plurality of flip-flops, in that an external reset cancel signal generated at the time of reset is selectively supplied to the clear terminals or to the preset terminals of the plurality of flip-flops, and in that, through generation of this external reset cancel signal, the initialization configuration data is set in the plurality of flip-flops.

According to a preferred mode of the first aspect of the invention, the reconfigurable integrated circuit device further has an initialized circuit; the configuration register has a first configuration register, which is initialized to first configuration data configuring the memory initialization circuit, and a second configuration register, which is initialized to second configuration data configuring an additional initialization circuit to initialize the initialized circuit; the reset is caused by a first reset signal generated at the time power is turned on and by a second reset signal generated by the CPU; and, in response to the first reset signal, the first and second configuration registers are initialized, while in response to the second reset signal, the first configuration register is initialized but the second configuration register is not initialized.

In order to attain the above objects, according to a second aspect of the invention, a reconfigurable integrated circuit device which is configured to an arbitrary computation state based on configuration data has a reconfiguration circuit unit, having a plurality of processor elements which are reconfigurable and a processor element network which connects the processor elements in an arbitrary state; and, a configuration control section, which supplies configuration data to the reconfiguration circuit unit, to configure the reconfiguration circuit unit in an arbitrary state;

wherein, in response to a reset signal, the configuration data supplied to the reconfiguration circuit unit is set to initialization configuration data, and based on the initialization configuration data, at least a portion of the reconfiguration circuit unit is configured as a memory initialization circuit which writes initial values to memory circuits.

By means of this invention, a memory initialization circuit which initializes memory at the time of reset is automatically configured within the reconfiguration circuit unit, so that there is no need to provide an initialization program, and moreover high-speed initialization processing can be performed by a dedicated configured circuit.

DESCRIPTION OF THE PREFERRED EMBODIMENTS

Figure 1:
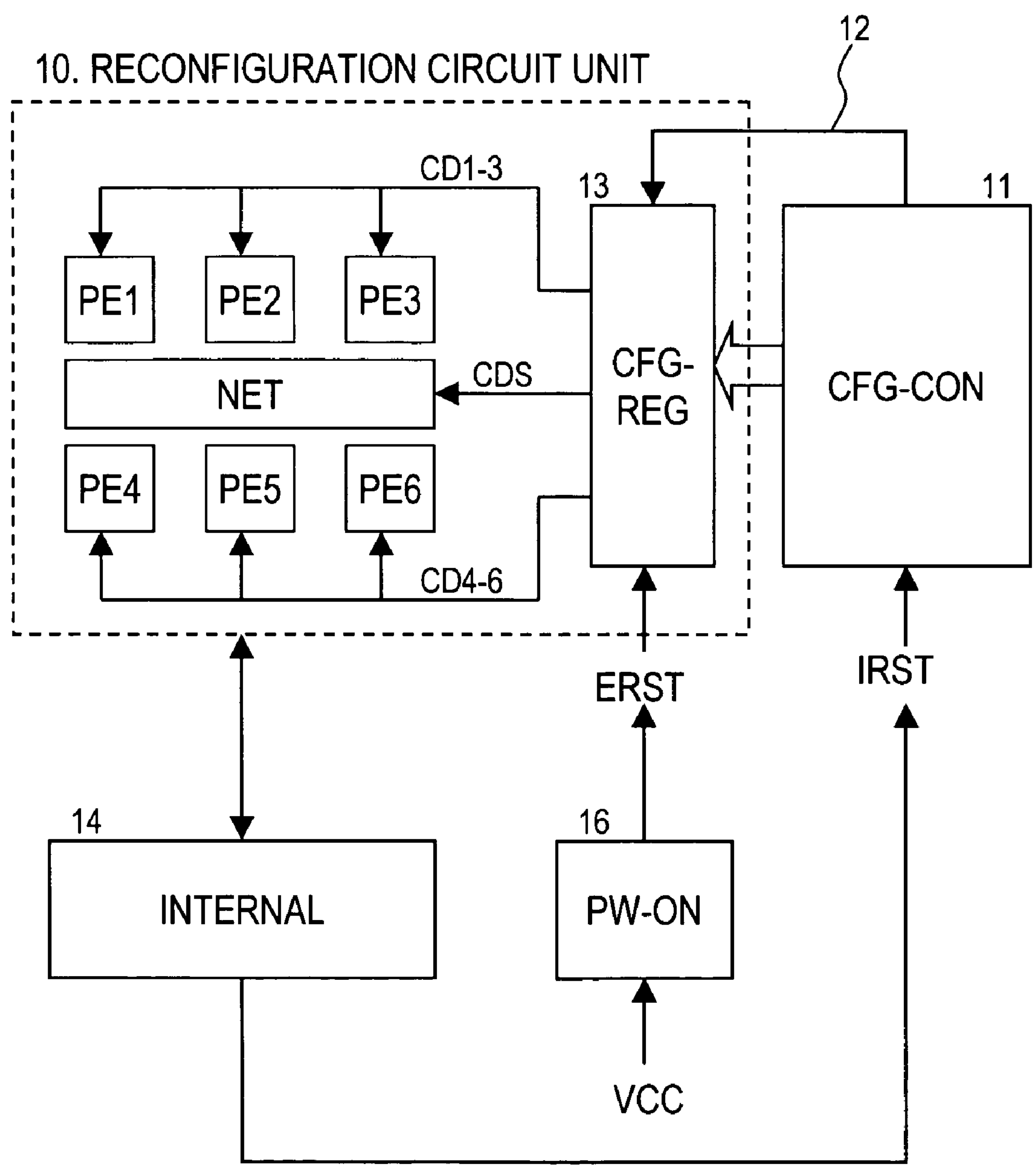
FIG. 1 shows a schematic configuration of an integrated circuit device in an embodiment.

Below, embodiments of the invention are explained referring to the drawings. However, the technical scope of the invention is not limited to these embodiments, but extends to the inventions described in the scope of claims and to inventions equivalent thereto.

FIG. 1 shows a schematic the configuration of the integrated circuit device of one embodiment. The integrated circuit device 1 has a reconfiguration circuit unit 10, having a plurality of processor elements PE1 to PE6 which can be reconfigured and a processor element network NET which connects these elements in an arbitrary state, and a configuration control section 11 which supplies configuration data CD to the processor elements PE and network NET of this reconfiguration circuit unit, to configure the reconfiguration circuit unit 10 in an arbitrary circuit state. In the configuration control section 11 are provided a sequencer and configuration memory to store configuration data, neither of which are shown; the sequencer reads and outputs desired configuration data from configuration memory, while outputting a state transition signal 12 in response to internal and external events.

Also, a configuration register 13 which latches configuration data CD in response to the state transition signal 12 from the configuration control section 11 is provided in the reconfiguration circuit unit 10; based on configuration data items CD1-3 and CD4-6 which are latched by this configuration register 13, the interiors of the processor elements PE1 to PE6 are configured in arbitrary states, and the network NET is configured in an arbitrary connection state based on the configuration data CDS. In the normal operating state after the reset state has been cancelled when power is turned on, the sequencer in the configuration control section 11 controls state transitions, and outputs the sequence configuration data CD corresponding to circuit states to be configured.

Processor elements comprise computation processor elements having computation circuits internally, and memory processor elements having internal memory. A computation processor element has an ALU having an adder, subtracter, multiplier and similar, a known-value generation circuit which outputs prescribed values, an input data processing section, a comparator and similar, and is configured in an arbitrary computation circuit state based on configuration data. In this way, arbitrary computation circuit states are configured using configuration data, and data processing is performed by these computation circuits; hence configuration data sent to a processor element PE is one type of processor element instruction. Further, configuration data sent to the processor element network NET is connecting information for connections between processor elements.

Apart from the configuration circuit unit 10, the integrated circuit device 1 has a fixed internal circuit 14 which is not an object for reconfiguration. The internal circuit 14 performs prescribed operations to transmit and receive prescribed signals with computation circuits configured within the reconfiguration circuit unit 10. A power-on reset circuit 16, which detects turning-on of the power supply VCC from outside and generates an external reset signal ERST, is provided in the integrated circuit device 1. At the time the power supply is turned on, the power-on reset circuit 16 sets the external reset signal ERST into the reset state (for example, L level), and after the power supply VCC rises, sets the external reset signal ERST into the cancellation state (for example, H level). That is, the H-level external reset signal ERST can also be called an external reset cancel signal.

The external reset cancel signal ERST (H-level external reset signal) generated when power is turned on is a signal instructing the start of processing to initialize internal circuits. In this aspect, in response to the external reset cancel signal ERST, at least a portion of the processor elements PE and the network NET in the reconfiguration circuit unit 10 are reconfigured as an initialization circuit. Specifically, in response to the external reset cancel signal ERST, the configuration register 13 is initialized to initialization configuration data. Then, based on this initialization configuration data, an initialization circuit is configured within the reconfiguration circuit unit 10.

When prescribed initialization operations performed by the initialization circuit configured when power is turned on are completed, the internal reset signal IRST from the internal circuit 14 goes to H level (internal reset cancel signal), and in response, normal operation of the configuration control section 11 is begun, and the necessary configuration data CD begins to be supplied to the reconfiguration circuit unit 10. By this means, the interior of the reconfiguration circuit unit 10 is configured to an arbitrary circuit state. When the normal operating state is entered, there is no longer a reason for existence of the initialization circuit configured within the reconfiguration circuit unit 10, which ceases to exist. That is, by using the reconfiguration circuit unit, which is not used when power is turned on, to temporarily configure an initialization circuit, initialization operations at power-on can be performed without the need to separately provide a fixed initialization circuit.

The configuration register 13 in FIG. 1 may be provided in the configuration control section 11.

Figure 2:
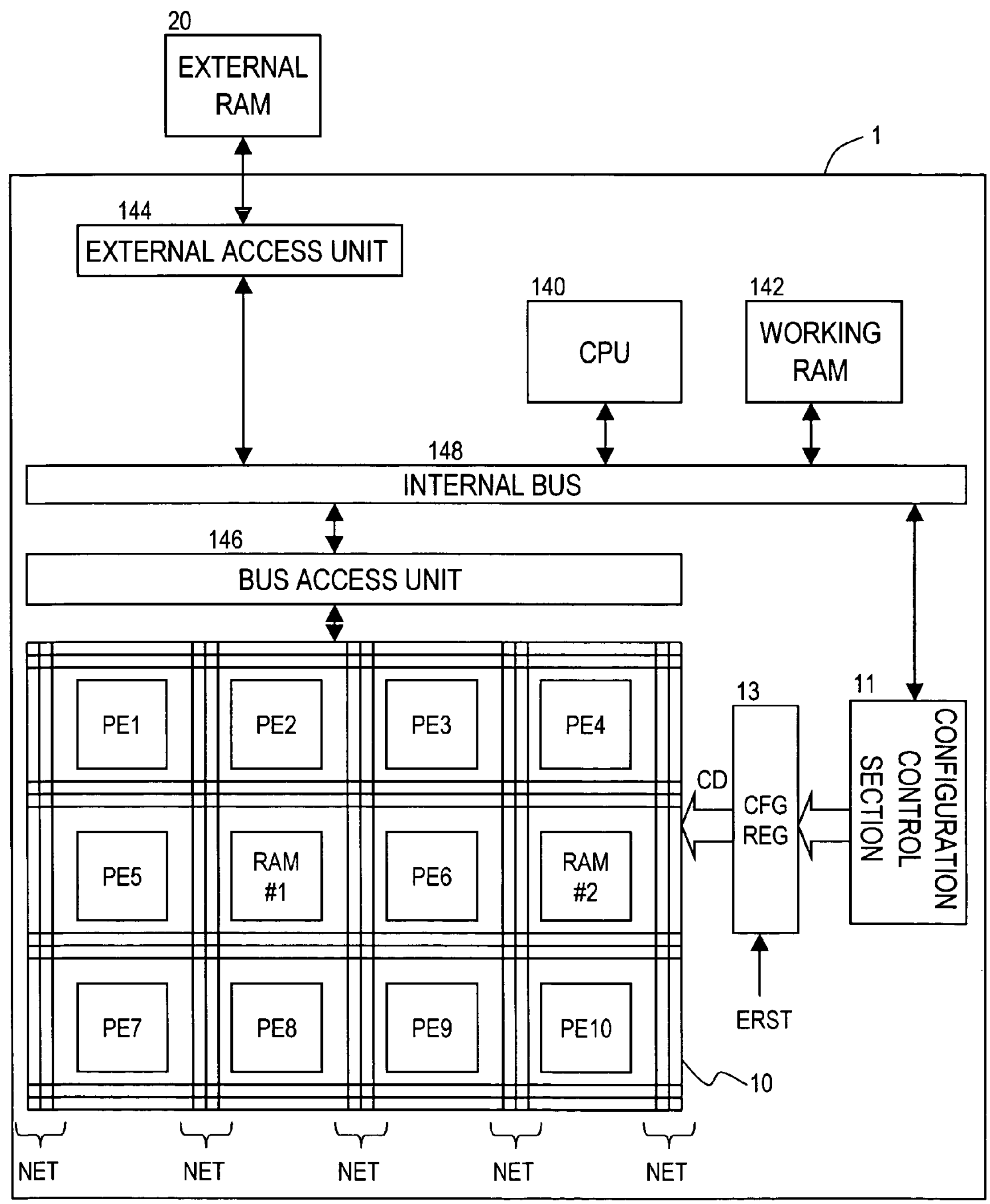
FIG. 2 shows the configuration of an integrated circuit device having an internal or external memory circuit in an embodiment.

FIG. 2 shows the configuration of an integrated circuit device of the embodiment, having an internal or external memory circuit. FIG. 2 shows the configuration more specifically than does FIG. 1. The integrated circuit device 1 is a microprocessor, and has, as internal circuits, a CPU 140 which sequentially executes programs; working RAM 142, which is used in computation processing and similar by the CPU; an internal bus 148; and an external access unit 144, which executes control to access external RAM 20 which is an external memory circuit.

Further, similarly to FIG. 1, a reconfiguration circuit unit 10 having a plurality of processor elements PE, a configuration control section 11 which supplies configuration data CD, which is instruction codes and connection information for use in reconfiguration, and a configuration register 13 which latches configuration data, are provided. In the example of FIG. 2, the reconfiguration circuit unit 10 has 12 processor elements and a processor element network NET; the 12 processor elements are 10 computation processor elements PE1 to 10, and two memory processor elements RAM#1, 2. A bus access unit 146 is provided between the reconfiguration circuit unit 10 and the internal bus 148. This bus access unit 146 controls bus access of the circuit reconfigured within the reconfiguration circuit unit 10.

This integrated circuit device causes the configuration control section 11 to output configuration data with appropriate timing, while the CPU sequentially executes internal programs, and causes the configuration register 13 to latch the data. By this means, the desired dedicated circuit is configured within the reconfiguration circuit unit 10. Then, as an internal resource, the desired dedicated circuit thus configured executes dedicated computation processing and similar in place of the CPU. During this interval, the CPU can execute other programs. When the desired dedicated circuit finishes computation processing, the CPU causes the configuration control section 11 to output other configuration data, which is latched by the configuration register 13. As a result, another dedicated circuit is reconfigured within the reconfiguration circuit unit 10.

In this way the CPU 140, by causing the configuration control section 11 to generate desired configuration data CD, configures desired dedicated computation circuits within the reconfiguration circuit unit 10, and can effect execution of desired computation processing by the dedicated computation circuits.

In the case of the above integrated circuit device 1, in response to reset at power-on, the working RAM 142, memory processor element RAM#1, 2, and other internal memory circuits, as well as the external memory circuits of external RAM 20, must be initialized. Processing for initialization is, specifically, processing to write initial values "0" or "1" to all memory cells within the memory circuits.

In a normal microprocessor, during power-on or at other reset times, the CPU executes an initialization program and initial values are written to internal memory circuits and external memory circuits by the CPU 140. However, this initialization through CPU operation requires the installation of an initialization program which is only infrequently used, and so is undesirable from the standpoint of program memory capacity. Further, in initialization processing to write initial values to memory by the CPU 140, the CPU sequentially writes initial values by changing addresses in order over the entire memory space on the memory map, so that if the memory capacity is large, a long amount of time is required for initialization processing.

Hence in this embodiment, during power-on or at other reset times, configuration data CD to configure a memory initialization circuit is supplied to the reconfiguration circuit unit 10 in response to the cancel state (H level) of an external reset signal ERST. As a result, a memory initialization circuit is configured within the reconfiguration circuit unit 10. It is desirable that four memory initialization circuits be configured, to initialize the working RAM 142, memory processor element RAM#1 and 2 within the reconfiguration circuit unit 10, and external RAM 20, which require initialization.

The configured memory initialization circuits then supply write addresses and initial values to the respective corresponding memory circuits, to initialize the respective memory circuits. By configuring a plurality of memory initialization circuits, the initialization of a plurality of memory circuits is performed in parallel, and so the time for the initialization operation can be shortened. Further, there are no initialization operations performed by the CPU 140, so that an initialization program is not necessary. And, during normal operation the memory initialization circuits have already been eliminated from within the reconfiguration circuit unit, and reconfigured into desired circuits by means of configuration data CD from the configuration control section 11. Hence there is no need to provide dedicated memory initialization circuits or initialization programs, and a portion of the reconfiguration circuit unit 10, which is not being utilized at the time of reset, can be employed to reconfigure memory initialization circuits to initialize memory units.

Configuration data CD to configure memory initialization circuits is automatically set in registers by initializing the configuration register 13 in response to an external reset cancel signal ERST. Hence configuration data CD is automatically generated by means of the hardware reset signal ERST, without being accompanied by execution of an initialization program by the CPU 140, so that memory initialization circuits are configured within the reconfiguration circuit unit 10, and initialization processing is executed.

In addition to power-on, there are cases in which memory initialization operations must be performed during reset due to software executed by the CPU. Hence the configuration register 13 may be initialized and configuration data CD for configuration of memory initialization circuits may be set in registers in response to a CPU reset signal (not shown) generated together with a CPU reset operation.

Figure 3:
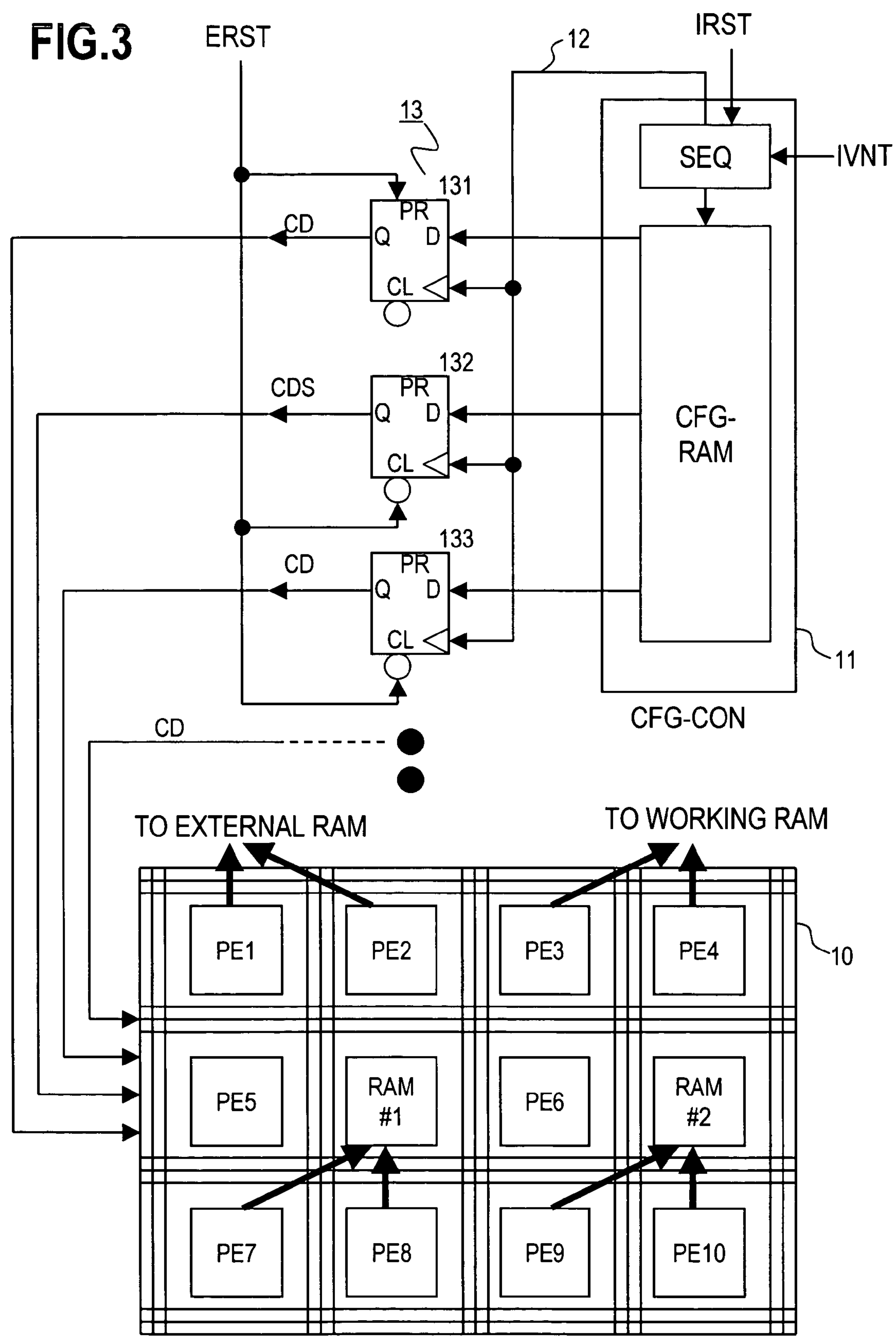
FIG. 3 shows the specific configuration of a configuration control section, configuration register, and reconfiguration circuit unit in an embodiment.

FIG. 3 shows the specific configuration of a configuration control section, configuration register, and reconfiguration circuit unit in this embodiment. The sequencer SEQ in the configuration control section 11 outputs a state transition signal 12 in response to an internal event (event signal IVNT), and causes configuration data to be output from the configuration memory CFG-RAM; the data is latched by the flip-flops 131-133 of the configuration register 13. The latched configuration data CD is instructions to determine the states of processor elements and connection information for the processor element network; by this means, the desired dedicated computation circuits are configured in the reconfiguration circuit unit 10.

These normal operations are performed after the internal reset signal IRST has gone to H level (the cancel state). Hence after power is turned on, the external power supply rises to a prescribed level and the external reset signal ERST reaches H level, and until initialization operations are completed and the internal reset signal IRST reaches H level, the configuration control section 11 does not perform normal operations. That is, no circuit states or connection states are configured within the reconfiguration circuit unit. Hence by having configuration data for configuration of initialization circuits set in the reconfiguration register 13 in response to the external reset signal ERST at power-on, initialization circuits are automatically configured within the reconfiguration circuit unit.

The signal line for the external reset signal ERST generated at power-on is connected to either the clear terminal CL or to the preset terminal PR of each of the flip-flops 131 to 133 of the configuration register 13. These connected terminals are determined in advance based on the configuration data for initialization. Hence when the external reset signal ERST goes to H level, the flip-flops 131 to 133 are set to either "0" or "1", according to whether the signal line is connected to the clear terminal or to the preset terminal. As a result, configuration data CD, CDS for initialization, according to the connection states of signal lines for the external reset signal ERST, is set in each of the flip-flops of the configuration register 13.

By means of this configuration data for initialization, for example the computation processor elements PE1, 2 can be configured as a memory initialization circuit for external RAM, the computation processor elements PE3, 4 can be configured as a memory initialization circuit for internal working RAM, the computation processor elements PE7, 8 can be configured as a memory initialization circuit for the memory processor element RAM#1 in the reconfiguration circuit unit 10, and the computation processor elements PE9, 10 can be configured as a memory initialization circuit for the memory processor element RAM#2.

Figure 4:
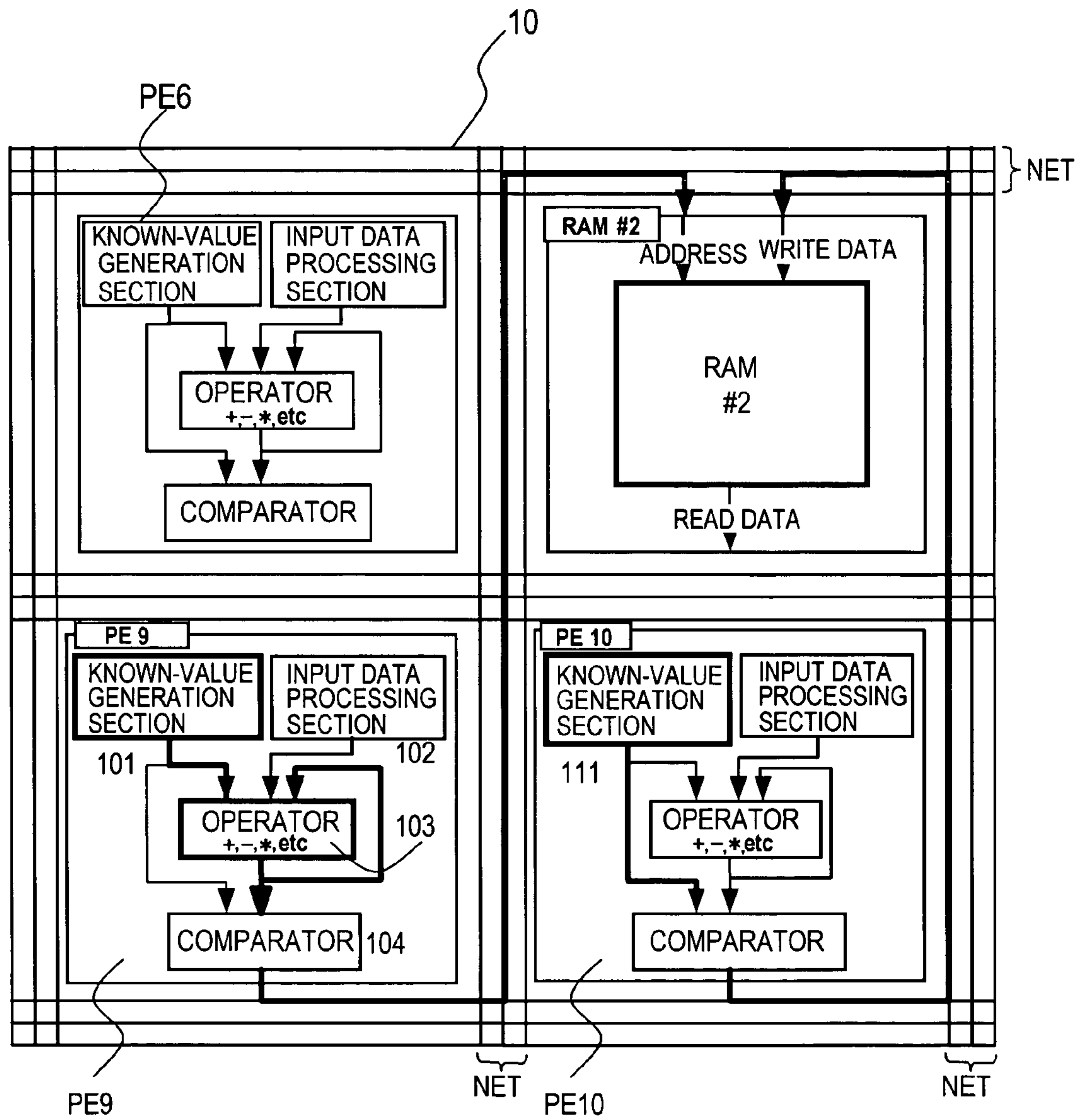
FIG. 4 shows an example of a reconfiguration circuit unit in which a memory initialization circuit is configured, in an embodiment.

FIG. 4 shows an example of a reconfiguration circuit unit in which a memory initialization circuit is configured in this embodiment. In FIG. 4, only the computation processor elements PE6, PE9, PE10 and memory processor element RAM#2 in the reconfiguration circuit unit 10 of FIG. 3 are shown. In FIG. 4, configuration of the memory initialization circuit is indicated by bold lines.

The processor element PE9 has a known-value generation section 101 which outputs prescribed fixed values in synchronization with a clock; an input data processing section 102 which processes input data; an operator 103 which performs addition, subtraction, multiplication, and other operations on input values; a comparator 104 which compares input values; and similar. The other processor elements PE6 and PE10 are similarly constructed. Using the configuration data CD for initialization, the processor element PE9 is configured such that the known-value generation section 101 generates an address incrementing value, the operator 103 adds the incrementing value to the output of the operator, and the addition result is supplied to the address input terminal of the memory processor element RAM#2. That is, the processor element PE9 is configured as an address generation circuit using the configuration data CD for initialization, which is an instruction to count values (perform cumulative addition). Similarly, the processor element PE10 is configured using the configuration data CD for initialization such that the known-value generation section 111 generates write data "0" or "1" and supplies the write data to the write data terminal of the memory processor element RAM#2. That is, the processor element PE10 is configured as a write data generation circuit using the configuration data for initialization, which is a known value generation instruction.

As a result of the above configuration, the processor element PE9 iteratively increments the address in synchronization with a clock, and the processor element PE10 supplies write data. As a result, initial value write data is written to all the memory cells in the memory processor element RAM#2.

Figure 5:
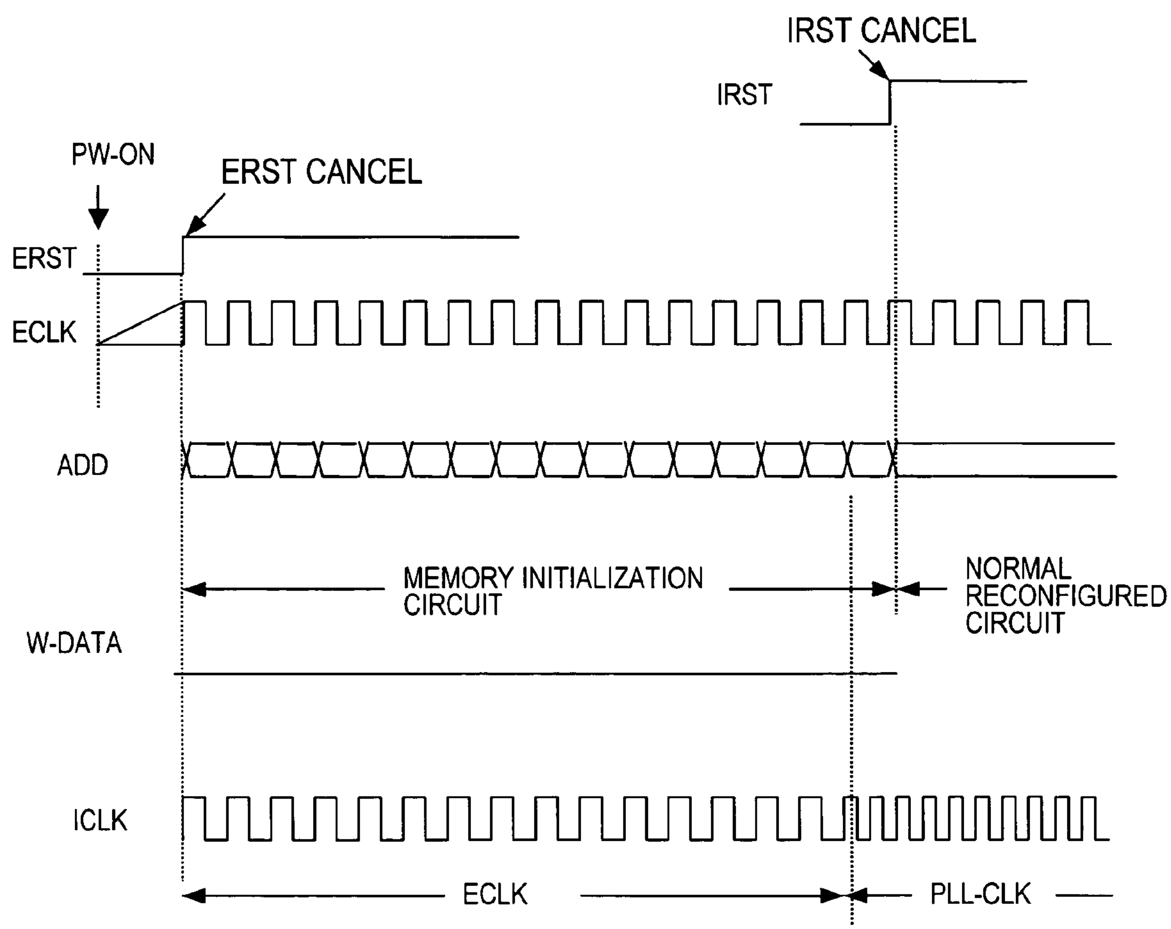
FIG. 5 is a waveform diagram showing the memory initialization operation at the time power is turned on in an embodiment.

FIG. 5 is a waveform diagram showing the memory initialization operation at the time power is turned on in the embodiment. When power is turned on (PW-ON), the external reset signal ERST goes to L level and the power supply potential rises. Upon rising to a prescribed level, the external reset signal ERST reaches H level, and the external reset is canceled. In response to this external reset cancel signal (ERST=H), configuration data for initialization is set in the configuration register. As a result, memory initialization circuits to initialize the various memory circuits are automatically configured within the reconfiguration circuit unit.

A PLL circuit, not shown, is provided in the integrated circuit device. The PLL circuit takes as input an external clock ECLK, and generates an internal clock ICLK with high frequency, phase-synchronized to the external clock. However, after power is turned on the PLL circuit is not yet in the locked state, and so the external clock ECLK is used as-is as the internal clock ICLK. When the PLL circuit reaches the locked state, the internal clock PLL-CLK generated by the PLL circuit is output as the internal clock ICLK. Then, the internal reset signal IRST rises to H level, and the internal circuits begin normal operation.

In this embodiment, memory initialization circuits configured within the reconfiguration circuit unit increment addresses in synchronization with the above internal clock ICLK, and supply the address ADD and the corresponding write data W-DATA to the memory circuit. By this means, initial-value write data is written to all the memory cells in memory circuits. After power is turned on, the external clock ECLK is supplied internally as-is as the internal clock ICLK, so that during this interval, the memory initialization circuits execute operations to write initial values in synchronization with the external clock ECLK.

When memory initialization processing, PLL lock operation and similar are completed, the internal reset signal IRST goes to H level, the internal reset state is canceled, and the reconfiguration circuit unit is reconfigured to various dedicated circuits for normal operations.

Figure 6:
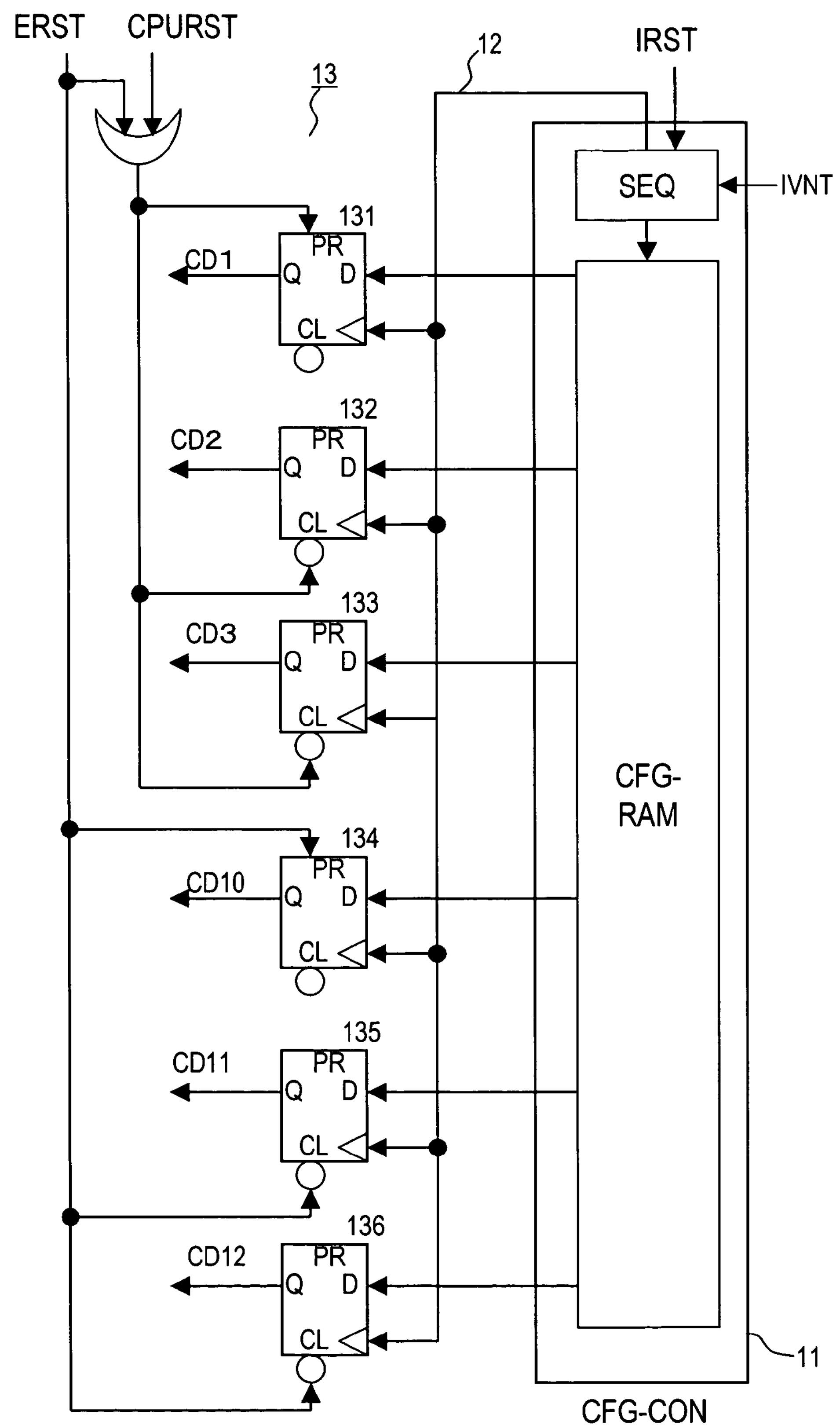
FIG. 6 shows a modified example of a configuration register of an embodiment.

FIG. 6 shows a modified example of a configuration register of the embodiment. In FIG. 6, the construction of the configuration control section 11 is as described above. On the other hand, the configuration register 13 has a first register group 131 to 133, and a second register group 134 to 136. The first register group 131 to 133 is set to configuration data CD1 to 3 to configure memory initialization circuits, either when the external reset signal ERST goes to H level, or when the CPU reset signal CPURST goes to H level, in response to these signals.

On the other hand, when the external reset signal ERST goes to H level, the second register group 134 to 136 is set to configuration data CD10 to 12 to configure PLL circuit initialization circuits in response to this signal. A PLL circuit initialization circuit is for example a counter circuit which counts the time required until a PLL circuit reaches the locked state.

Thus in response to the H level of the external reset signal ERST at power-on, the configuration data CD1 to CD3 for memory initialization circuits and the configuration data CD10 to CD12 for PLL circuit initialization are automatically generated, and the respective initialization circuits are configured within the reconfiguration circuit unit. On the other hand, in response to the H level of the CPU reset signal CPURST at the time of reset generation by the CPU, only the configuration data CD1 to CD3 for memory initialization circuits is automatically generated, so that memory circuits are initialized. At this time, PLL circuits continue in the normal operating state.

The configuration data of FIG. 6 is shown for only three bits each; in an actual example, a greater number of bits are used.

Figure 7:
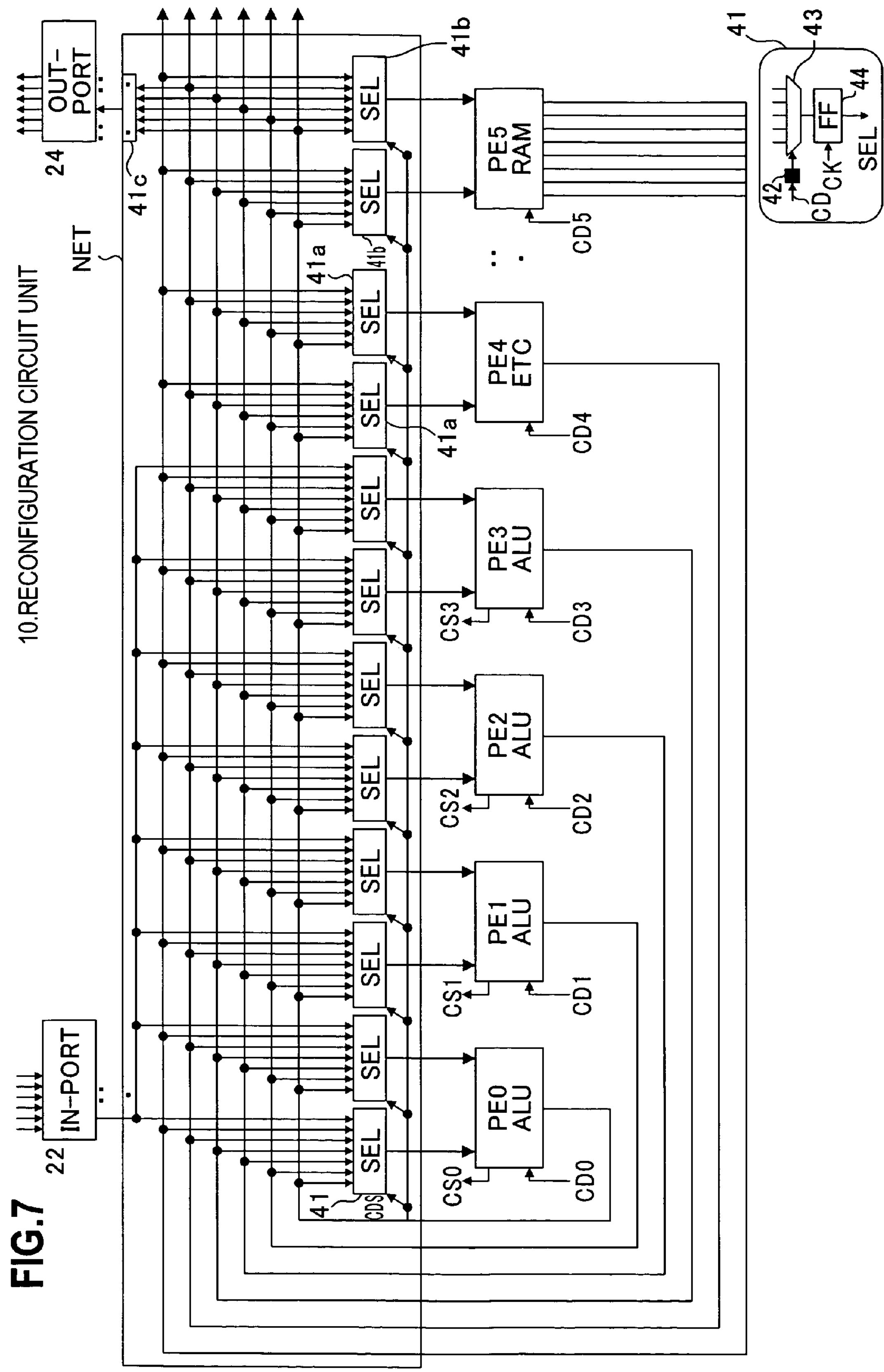
FIG. 7 shows a configuration example of a processor element network NET in an embodiment.

FIG. 7 shows an example of the configuration of the processor element network NET in the embodiment. The operation processor elements PE0 to PE3, the memory processor element PE5, and another processor element PE4 are configured so as to be connectable via selectors 41 which are switches in the network NET. Each of the processor elements PE0 to PE5 can be constructed in an arbitrary configuration based on configuration data CD0 to CD5, and the selectors 41 (41*a*, 41*b*, 41*c*) in the network NET also can be constructed in an arbitrary configuration based on the configuration data CDs.

As indicated in an example on the bottom-right of the figure, the selectors 41 comprise a register 42 which stores configuration data CD, a selector circuit 43 which selects the input according to data in the register 42, and a flip-flop 44 which latches the output of the selector circuit 43 in synchronization with the clock CK. The network NET enables desired connections to the data input port 22 and output port 24 via the selector 41.

Figure 8:
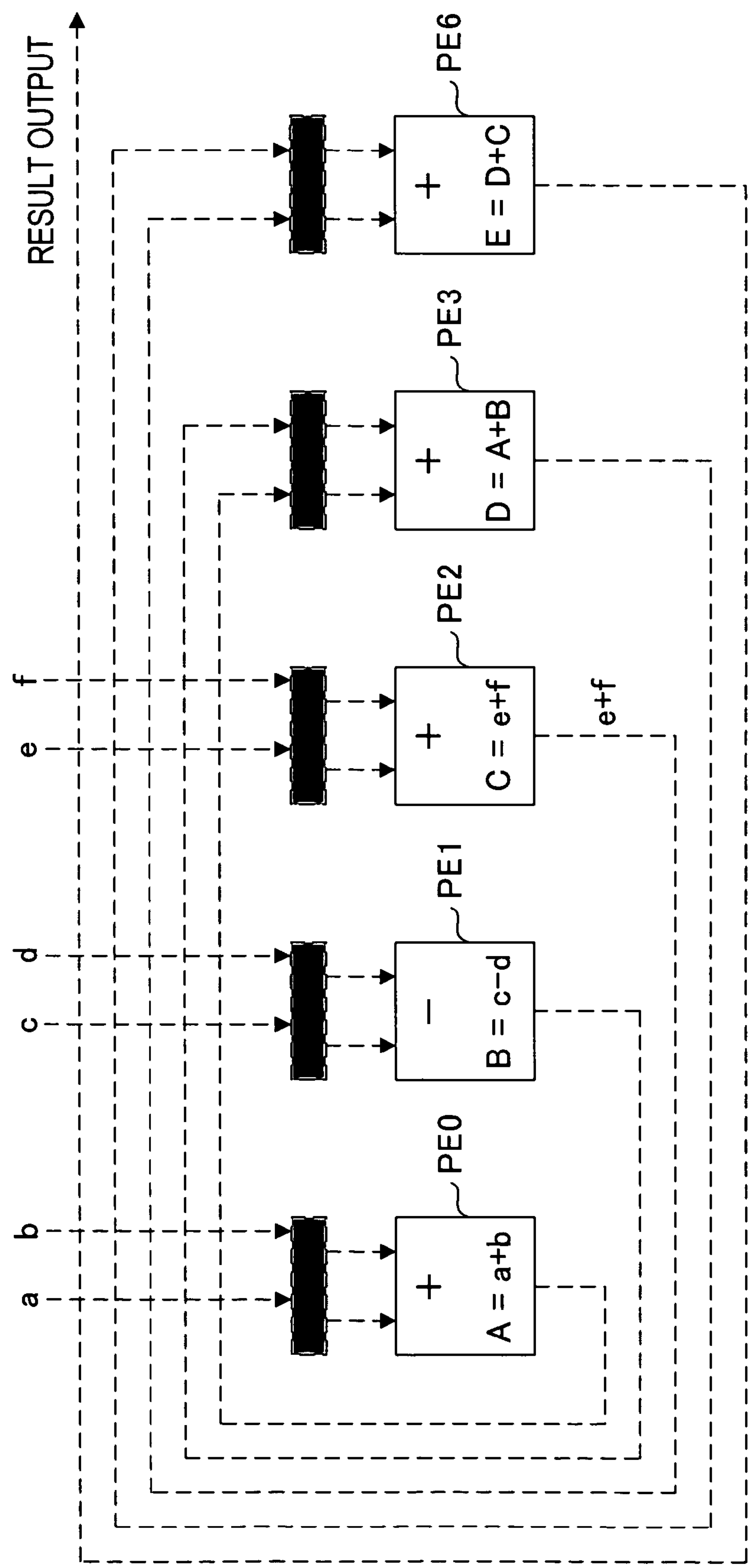
FIG. 8 shows an example of a circuit state, configured using configuration data in normal operation in an embodiment; and, FIG. 9 shows an example of a circuit state, configured using configuration data in normal operation in an embodiment.
Figure 9:
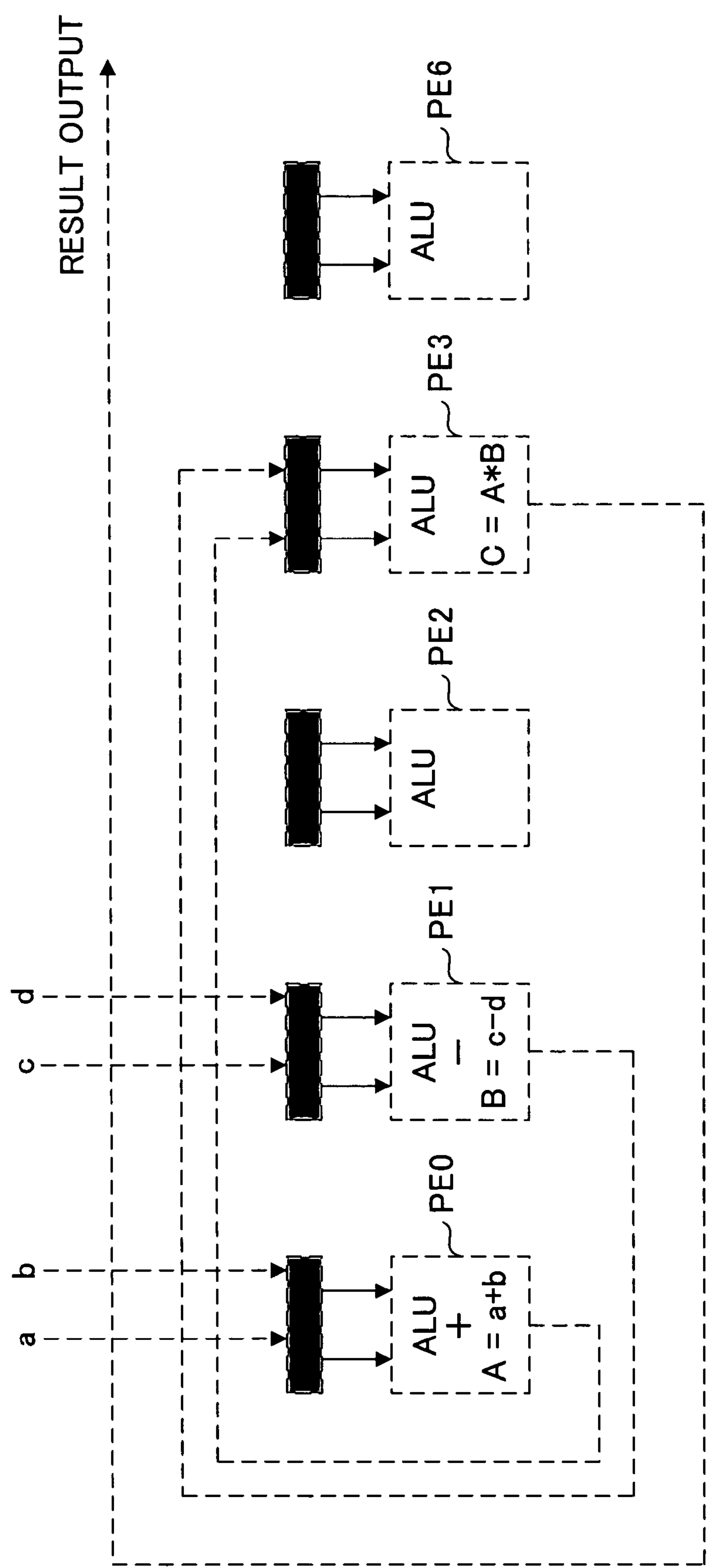

FIG. 8 and FIG. 9 show examples of the circuit state constructed using configuration data in normal operation in this embodiment. In these figures, the operation processor elements PE0 to PE3 and PE6, which can dynamically construct operational circuits, are connected by the network NET to construct a dedicated operational circuit which performs prescribed arithmetic operations at high speed.

The example of FIG. 8 is an example in which a dedicated operational circuit is constructed to execute, for input data a, b, c, d, e, f, the following arithmetic operational expression.

$$(a+b)+(c-d)+(e+f)$$

According to this configuration example, the processor element PE0 is constructed as an operational circuit to compute A=a+b, the processor element PE1 is constructed as an operational circuit to compute B=c−d, the processor element PE2 is constructed as an operational circuit to compute C=e+f, the processor element PE3 is constructed as an operational circuit to compute D=A+B, and the processor element PE6 is constructed as an operational circuit to compute E=D+C. Each of the data items a through f is supplied from a memory processor element or similar, not shown, and the output of the processor element PE6 is output to a memory processor element and external equipment as an operation result E.

The processor elements PE0, PE1, PE2 perform operational processing in parallel, and on obtaining the operation results, the processor element PE3 performs an operation to compute D=A+B, and finally the processor element PE6 performs an operation to compute E=D+C. By thus constructing a dedicated operational circuit, parallel operation is enabled, and the efficiency of operation processing can be improved.

Each operation processor element internally incorporates an ALU, adder, multiplier, comparator and similar, and based on configuration data CD can be reconstructed as an arbitrary operational circuit. Through construction as shown in FIG. 8, a dedicated operational circuit which performs only the above arithmetic operation can be constructed. By constructing this dedicated operational circuit, a plurality of arithmetic operations can be executed in parallel, and the efficiency of operations can be improved.

The example of FIG. 9 is an example in which a dedicated operational circuit is constructed which, for input data a through d, executes the arithmetic operation (a+b)*(c+d). The processor element PE0 is constructed as an operational circuit to compute A=a+b, the processor element PE1 is constructed as an operational circuit to compute B=c−d, the processor element PE3 is constructed as an operational circuit to compute C=A*B, and the operation result C is output to a memory processor element or to an external cluster. In this case also, the processor elements PE0 and PE1 perform operation processing in parallel, and the processor element PE3 performs operation processing to compute C=A*B given the operation results A and B. Hence by constructing this dedicated operational circuit, the operation efficiency can be improved, and large quantities of data can be subjected to arithmetic operations with higher efficiency.

As explained above, in the embodiment, according to the fact that the reconfiguration circuit unit is not configured to a desired circuit state by the configuration control section during the initialization interval when power is turned on, initialization circuits necessary for initialization operations, and more specifically initialization circuits comprising address generation circuits and initial value generation circuits, are configured. In normal operations following the initialization operations, the configuration control section configures the desired circuit states within the reconfiguration circuit unit. During normal operation, there is no need for any initialization circuits to exist.

In the above embodiment, the clear terminals and preset terminals of flip-flops in registers were used to set initialization configuration data in configuration registers. However, other methods are possible. An initialization configuration data generation section may be provided separately from the configuration control section, and state transition signals may be supplied while supplying initialization configuration data to the configuration registers from the initialization configuration generation section in response to an external reset signal ERST. That is, if initialization data can be automatically latched by configuration registers at the time power is turned on, then initialization circuits can be similarly configured within the reconfiguration circuit unit.

Further, in the above embodiment configuration registers are provided in the reconfiguration circuit unit; but configuration registers may be provided within the configuration control section.

What is claimed is:

1. A reconfigurable integrated circuit device, configured to an arbitrary computation state based on configuration data, comprising:

a reconfiguration circuit unit, having a plurality of processor elements which are reconfigurable and a processor element network which connects said processor elements in an arbitrary state; and a configuration control section, which supplies configuration data to said processor elements and to said processor element network, to configure said reconfiguration circuit unit in an arbitrary state, wherein in response to reset, at least a portion of said reconfiguration circuit unit is configured as a memory initialization circuit which writes initial values to internal memory or to external memory; and after completion of operation of the memory initialization circuit, said configuration control section begins supplying said configuration data.

2. The reconfigurable integrated circuit device according to claim 1, further comprising a configuration register which acquires said configuration data in response to a state transition signal from the configuration control section, wherein based on configuration data acquired by the configuration register, said reconfiguration circuit unit is configured in said arbitrary state, and in response to said reset, said configuration register is initialized to initialization configuration data corresponding to said memory initialization circuit state.

3. The reconfigurable integrated circuit device according to claim 2, wherein said configuration register has a plurality of flip-flops, an external reset cancel signal generated at the time of said reset is selectively supplied to clear terminals or to preset terminals of the plurality of flip-flops, and, through generation of the external reset cancel signal, said initialization configuration data is set in said plurality of flip-flops.

4. The reconfigurable integrated circuit device according to claim 2, further comprising an initialized circuit, wherein said configuration register has a first configuration register, which is initialized to first configuration data configuring said memory initialization circuit, and a second configuration register, which is initialized to second configuration data configuring an additional initialization circuit to initialize said initialized circuit;

said reset is generated by a first reset signal generated at a time power is turned on and by a second reset signal generated by a CPU; and in response to said first reset signal, said first and second configuration registers are initialized, while in response to said second reset signal, said first configuration register is initialized but said second configuration register is not initialized.

5. The reconfigurable integrated circuit device according to claim 1, wherein said internal memory comprises at least one from among a working memory connected to an internal bus and a memory element within said reconfiguration circuit unit, and said memory initialization circuit has a plurality of circuits which initialize each of said internal memory and said external memory.

6. The reconfigurable integrated circuit device according to claim 1, wherein said reset is generated by either one of, or both of, a first reset signal generated when power is turned on, and a second reset signal generated by a CPU.

7. The reconfigurable integrated circuit device according to claim 1, wherein said memory initialization circuit comprises an address generation circuit which generates successive addresses of the memory circuit for initialization and an initial value generation circuit which generates said initial values, and based on said configuration data, the address generation circuit and the initial value generation circuit are configured by said processor elements and said processor element network.

8. The reconfigurable integrated circuit device according to claim 7, wherein said address generation circuit successively generates said addresses in synchronization with a clock, said initial value generation circuit generates initial values to be written to the addresses in synchronization with a clock, and the addresses and initial values are supplied to the memory circuit to be initialized.

9. A reconfigurable integrated circuit device, configured to an arbitrary computation state based on configuration data, comprising:

a reconfiguration circuit unit, having a plurality of processor elements which are reconfigurable and a processor element network which connects said processor elements in an arbitrary state; and a configuration control section, which supplies configuration data to said reconfiguration circuit unit, to configure said reconfiguration circuit unit in an arbitrary state;

wherein, in response to a reset signal, said configuration data supplied to said reconfiguration circuit unit is set to initialization configuration data, and based on the initialization configuration data, at least a portion within said reconfiguration circuit unit is configured as a memory initialization circuit which writes initial values to memory circuits.

10. The reconfigurable integrated circuit device according to claim 9, wherein said memory initialization circuit comprises an address generation circuit which generates successive addresses of the memory circuit for initialization and an initial value generation circuit which generates said initial values, and based on said configuration data, the address generation circuit and the initial value generation circuit are configured by said processor elements and said processor element network.

11. The reconfigurable integrated circuit device according to claim 10, wherein said address generation circuit successively generates said addresses in synchronization with a clock, said initial value generation circuit generates initial values to be written to the addresses in synchronization with a clock, and the addresses and initial values are supplied to the memory circuit to be initialized.

* * * * *